(12) United States Patent
Holland

(10) Patent No.: US 6,578,202 B1
(45) Date of Patent: Jun. 10, 2003

(54) SIGNAL SPLITTER FOR CABLE TV

(76) Inventor: Michael Holland, 107 Via del Cielo, Santa Barbara, CA (US) 93109

( * ) Notice: Subject to any disclaimer, the term of this patent is extended or adjusted under 35 U.S.C. 154(b) by 217 days.

(21) Appl. No.: 09/644,755

(22) Filed: Aug. 24, 2000

(51) Int. Cl.$^7$ ............................................. H04N 7/173
(52) U.S. Cl. ........................ 725/127; 725/149; 333/100; 333/124; 333/131; 455/339
(58) Field of Search ................................. 725/149, 127; 333/100, 124, 131; 455/339

(56) References Cited

U.S. PATENT DOCUMENTS 5,347,245 A * 9/1994 Wright, Jr.
5,977,843 A * 11/1999 Watanabe
6,005,442 A * 12/1999 Maeda et al.

\* cited by examiner

*Primary Examiner*—Andrew Faile
*Assistant Examiner*—Ngoc Vu
(74) *Attorney, Agent, or Firm*—Michael G. Petit

(57) ABSTRACT

A standard, high performance CATV signal splitter that operates at high signal levels with greatly reduced intermodulation distortion. The circuit retains the presently accepted performance standards for RF signal splitters while reducing the unacceptable distortion resulting from the higher signal levels currently encountered in applications such as Internet communication. The improved signal splitter circuitry reduces or eliminates signal distortion due to magnetization of the ferrite core material. Such core magnetization occurs in prior art signal splitters when the high permeability ferrite core of the transformer is exposed to random electrical spikes, power surges, and static charge build-up. In the present invention, a tuned circuit is added in the output balance section of a prior art signal splitter to confine the transformer performance to the narrower range of CATV frequencies. The "frequency narrowing" or tuning circuit allows a low performance ferrite core to be used in the transformer comprising the signal splitter while allowing the splitter to meet both the criteria of low distortion and magnetization at higher signal input levels, and provide state-of-the-art electrical signal performance.

5 Claims, 2 Drawing Sheets

SIGNAL SPLITTER FOR CABLE TV

BACKGROUND OF THE INVENTION

1. Field of the Invention

This invention relates to high frequency signal splitter devices and more particularly to a signal splitter for CATV signal splitting.

2. Prior Art

Hybrid transformers for wideband (5–1000 MHz) high frequency applications such as Cable TV (CATV) have remained unchanged for the last twenty years. The prior art hybrid transformer design, shown in FIG. 1, consists of a 2-stage impedance transformer that converts a single input of 75 ohms into two outputs, each having a 75 ohm impedance. The device consists of a 2-stage transformer wherein the first stage converts the 75 ohm impedance to 37.5 ohms, and the second stage converts the 37.5 ohm back to two 75 ohm outputs. Since the hybrid transformer's inception, the performance of the device as a signal splitter has been based on three factors: insertion loss, isolation between ports, and return loss or matching. These performance factors for a hybrid transformer-type signal splitter deteriorate as the total bandwidth is expanded and higher frequencies are used.

The increased use of the available bandwidth in coaxial cables for use in Cable TV has required advancement in signal splitter technology to meet new standards for performance. Twenty years ago, the splitter devices only needed to operate over a bandwidth of 54–300 MHz. Today, due to the use of over 100 analog channels, together with the addition of internet signals in the lower frequencies, signal splitters having a greatly expanded bandwidth of 5–1000 MHz are required. In addition, the minimum performance specifications for signal splitters have also increased. The increased performance standards have not been achieved by changing the circuitry of hybrid transformer signal splitter, but rather by improving ferrite core material used in the transformer and providing better grounding and layout of the device. Improved ferrite core materials have been responsible for the bandwidth and specification improvement. Specifically, the increased permeability of the ferrite core, which is the ability to contain and transfer the electromagnetic waves within the core material (efficiency), is principally responsible for the improvement in performance. Early ferrite materials used in signal splitters did not have permeabilities over 300 u needed for these new wideband applications. As the operational bandwidths reached 1000 MHz, the demand for signal splitters having high performance stimulated the development of ferrites having permeability factors of 1500 u. Such improved ferritic core materials enabled the continued use of hybrid transformer-type signal splitters meeting higher industry-imposed performance standards with the same circuit design used for 20 years.

High performance ferrites have a higher sensitivity and a lower dynamic range of signal levels which can be processed. For non-linear devices in general, and many amplifiers in particular, the desired linear performance of the device is related to the dynamic range constraints. A linear response can only be realized over a small dynamic range of input signal level. The ferrite transformer core, used in modem, high performance signal splitting devices, is a non-linear material; requiring significant limitations on the input signal level in order to operate in their linear region. In other ferrite core applications, such as magnetized data memories and RF switches, the ability to drive the material into non-linear or saturated conditions is exploited.

Cable TV applications require a signal splitter device to work linearly over a wide bandwidth but only at low input levels, usually in the range of between −10 dBmv (200 microvolts) to +35 dBm (80 millivolts). Internet, pay-per-view TV, and telephone signal transmission via coaxial cable require the CATV system to transmit high level return communication signals from the home at levels of 50–60 dBmv (maximum of 1 volt level). Accordingly, hybrid splitters are now required to maintain the bandwidth and performance at higher signal levels. It had been found that the second and third order non-linear distortion levels produced in response to the higher signal levels transmitted at the home are unacceptably high; the level of generated harmonics ranging from −100 to −70 dBC (from the transmitted carrier). The high level of the harmonics interfere with TV channels and other data services that fall in a $2^{nd}$ or $3^{rd}$ multiple of the high level signal.

Ferrite cores are magnetized by electrical spikes, noise, or surges, which are common to all communication systems connected to a power source. It has been found that when a magnetized ferrite is presented with signals at around 1 volt, as is typical with Internet applications, the harmonics also increased by a factor of 100. The above new application of high level transmitted signals through the CATV splitters has required the development of a new design which limits magnetization, has low harmonics (−105 dBc) at high signal input levels while maintaining the currently accepted performance levels (insertion, isolation, and return loss). While the dynamic range, magnetization resistance, and distortion can be improved with ferrite cores of lower "u" permeabilities, the bandwidth is unacceptable. There remains a need for a CATV splitter that can operate in a high signal level environment while maintaining high electrical performance, low distortion, and immunity from magnetization enhanced distortion.

SUMMARY

It is a primary object of the invention to provide a CATV signal splitter having a broad bandwidth and low distortion at high signal input levels.

It is a further object of the invention to provide a broad bandwidth, high frequency signal splitter device comprising a transformer having a low permeability core material.

The features of the: invention believed to be novel are set forth with particularity in the appended claims. However the invention itself, both as to organization and method of operation, together with further objects and advantages thereof may be best be understood by reference to the following description taken in conjunction with the accompanying drawings in which:

DESCRIPTION OF THE PREFERRED EMBODIMENTS

The present invention provides a two-section signal splitter device employing an autotransformer having a low-permeability ferrite core material exhibiting low magnetization properties, even at high signal input levels. The invention adds a novel tuned circuit section to the second stage (output balance section) of a traditional signal splitter (i.e., a signal splitter employing an autotransformer with a low-permeability core) to provide the acceptable signal performance and bandwidth with this older ferrite core. The tuned circuit in the output balance section confines the transformer performance to the narrower range of CATV frequencies. This "frequency narrowing" or tuning circuit allows the lower performance ferrite core to be used in a signal splitter device while providing low distortion and magnetization at higher input levels, and state-of-the-art electrical signal performance.

Figure 1:
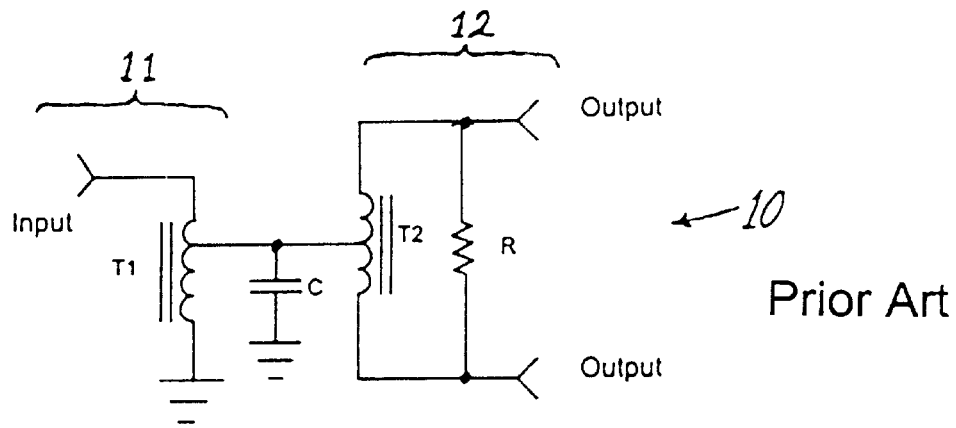
FIG. 1 is a schematic diagram.of an electronic signal splitter circuit in accordance with the prior art.
Figure 2:
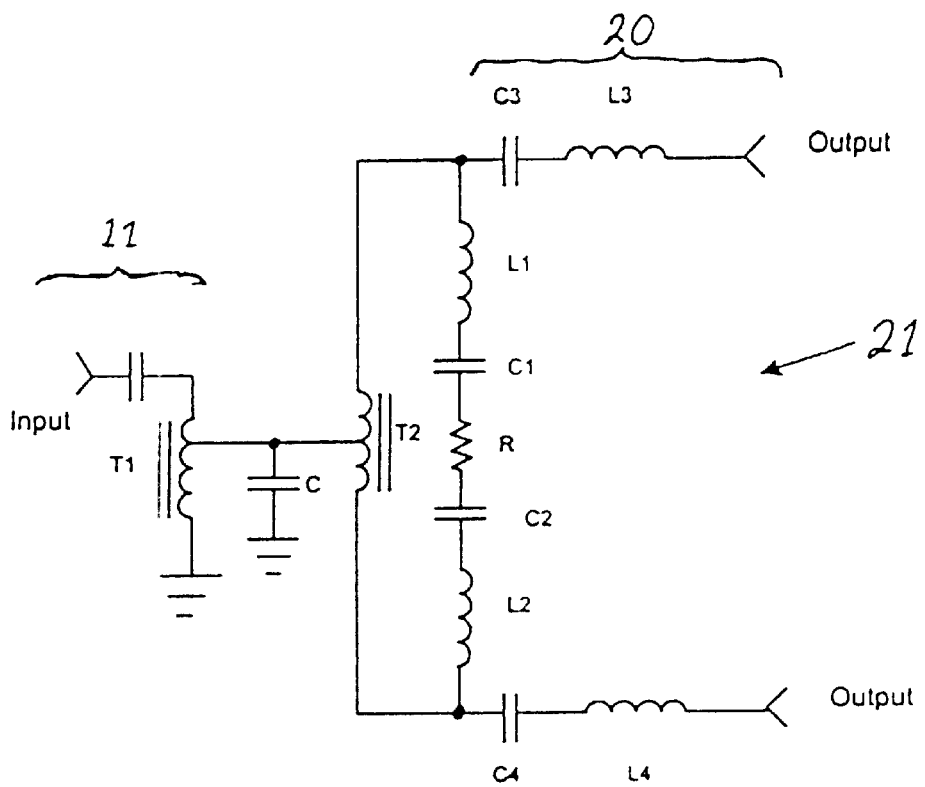
FIG. 2 is a schematic diagram of an electronic signal splitter circuit in accordance with the present invention.

Turning first to FIG. 1, an autotransformer-type signal splitter in accordance with the prior art is indicated at numeral 10. The signal input section 11 converts a 75 ohm input impedance to 37.5 ohms, and the second stage or signal output section 12 converts 37.5 ohms to two 75 ohm output ports. Autotransformers T1 and T2 are used in place of dual winding transformers because of their lower cost (they have only one winding and a center tap) and reduced interwinding capacitance. The signal output section 12 of the signal splitter 10 converts a half impedance (37.5 ohms) to two 75 ohm impedance outputs.

The bandwidth performance of the prior art signal splitter 10 can be improved by increasing the magnetic permeability of the core material comprising the autotransformer, but this solution provides signal distortion at high signal input levels. In accordance with the present invention, the magnetic permeability of the core material comprising the autotransformer is kept low. A tuned circuit 20 is added to the output section 12 of the prior art signal splitter 10 to narrow the frequency response thereof to be operable in the CATV frequency range. The tuned or "frequency narrowed" signal splitter 21 has low distortion and magnetization at high signal input levels and electrical signal performance characteristics that are acceptable.

Figure 3:
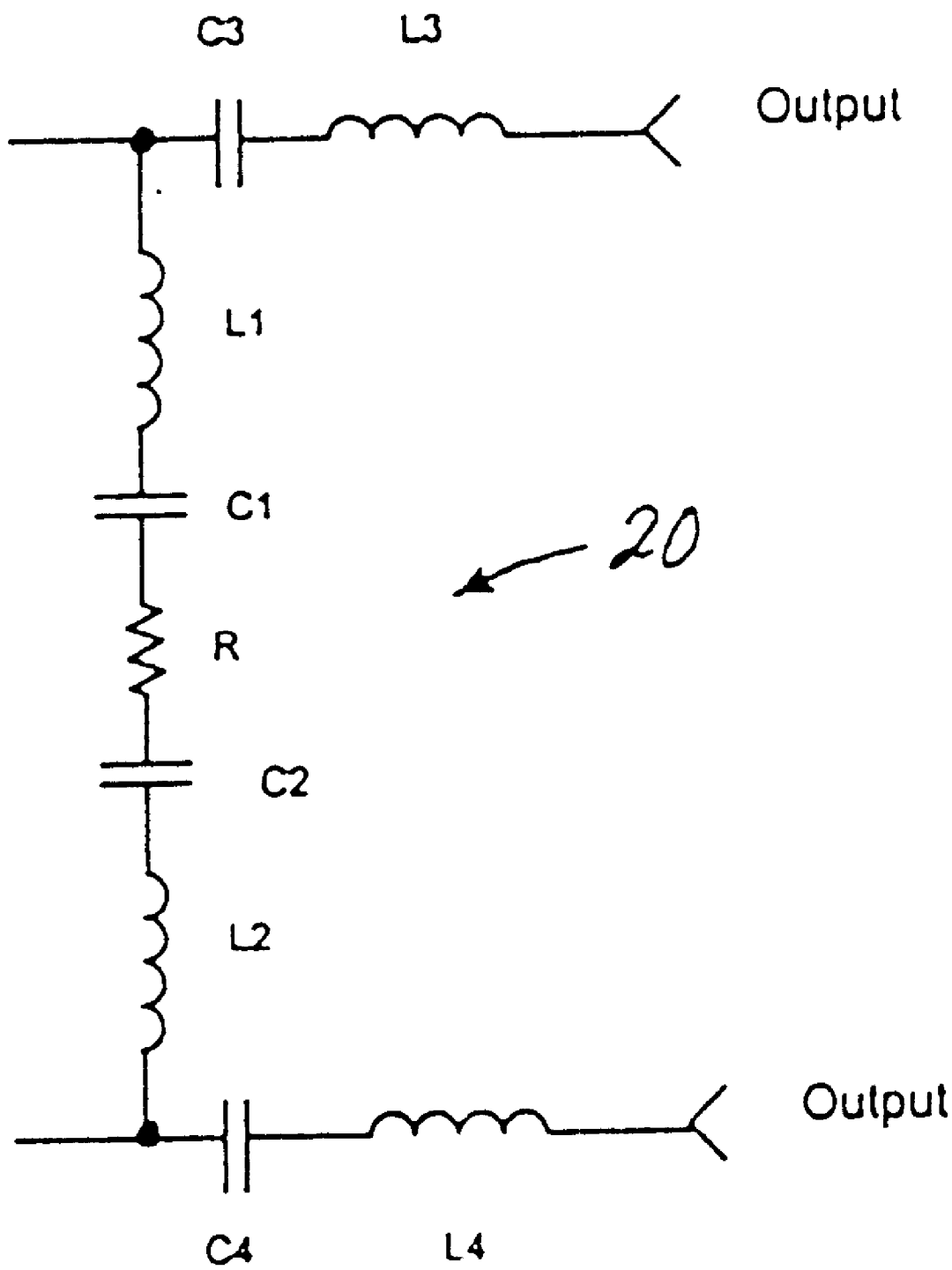
FIG. 3 shows the portion of the signal splitter circuit of FIG. 2 that is the subject of the present invention.

The tuning circuit 20 is shown in FIG. 3. C1, C2, L1, and L2 form two resonant circuits to tune the optimized balance resistor R to the low permeability ferrite core transformer T2. Capacitors C3 and C4 are used in many present signal splitters to block the transmission of low frequency or DC signals. Inductors L3 and L4 are used to improve the matching of the circuit to the outside load. In the present signal splitter, capacitors C1 and C2, and inductors L1 and L2 are novel. The circuit employs identical components for balancing on both sides of resistor R.

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What I claim is:

1. An RF signal splitter comprising: (a) a transformer having a first winding wound on a ferrite core, one end of said first winding forming an RF signal input port operable for receiving an RF signal from a RF signal source, and a second winding wound on said ferrite core, said second winding providing first and second RF signal output ports; and (b) an output balancing circuit connecting said first and second RF signal output ports in parallel with said second winding, said output balancing circuit consisting of a first inductor L1, a first capacitor C1, a resistor R, a second capacitor C2 and a second inductor L2 in series connection, said first RF output port comprising a third capacitor C3 and a third inductor L3 in series connection and said second RF output port comprising a fourth capacitor C4 and a fourth inductor L4 in series connection.

2. The RF signal splitter of claim 1 wherein the product L1C1=L2C2.

3. The RF signal splitter of claim 1 wherein L1=L2, and C1=C2.

4. An RF signal splitter comprising: (a) a transformer having a first winding wound on a ferrite core, one end of said first winding forming an RF signal input port operable for receiving an RF signal from a RF signal source, and a second winding wound on said ferrite core, said second winding providing first and second RF signal output ports; and (b) an output balancing circuit connecting said first and second RF signal output ports in parallel with said second winding, said output balancing circuit consisting of a band pass filler; wherein said first RF output port is a band pass filter comprising a capacitor and an inductor in series connection and said second RF output port is a band pass filter comprising a capacitor and an inductor in series connection.

5. The RF signal splitter of claim 4 wherein said band pass filter comprises an inductor and a capacitor in series connection.

* * * * *